United States Patent
Kang et al.

(10) Patent No.: US 11,636,887 B2
(45) Date of Patent: Apr. 25, 2023

(54) SEMICONDUCTOR DEVICE HAVING DUMMY LINES ELECTRICALLY CONNECTED WITH EACH OTHER

(71) Applicant: SK hynix Inc., Icheon-si (KR)

(72) Inventors: Byung In Kang, Icheon-si (KR); Nak Kyu Park, Icheon-si (KR); Han Kyu Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/359,223

(22) Filed: Jun. 25, 2021

(65) Prior Publication Data

US 2022/0254395 A1  Aug. 11, 2022

(30) Foreign Application Priority Data

Feb. 8, 2021  (KR) .................. 10-2021-0017532

(51) Int. Cl.
  *G11C 8/14*  (2006.01)
  *G11C 8/10*  (2006.01)
  *G11C 8/08*  (2006.01)
  *G11C 7/06*  (2006.01)

(52) U.S. Cl.
  CPC .............. *G11C 8/14* (2013.01); *G11C 7/06* (2013.01); *G11C 8/08* (2013.01); *G11C 8/10* (2013.01)

(58) Field of Classification Search
  CPC ..... G11C 8/14; G11C 7/06; G11C 8/08; G11C 8/10
  USPC ............................................. 365/63
  See application file for complete search history.

(56) References Cited

U.S. PATENT DOCUMENTS

2016/0163365 A1\*  6/2016  Yang ................ G11C 7/14
  365/51
2019/0287988 A1\*  9/2019  Takekida ......... H01L 27/11519

FOREIGN PATENT DOCUMENTS

| KR | 1020050002077 A | 1/2005 |
| KR | 1020090065943 A | 6/2009 |
| KR | 20170003835 | * 1/2017 |

\* cited by examiner

*Primary Examiner* — Huan Hoang

(57) ABSTRACT

A semiconductor device may include a memory bank, an X-decoder adjacent to the memory bank in a row direction, a Y-decoder adjacent to the memory bank in a column direction, X-lines extending from the X-decoder across the memory bank in the row direction, Y-lines extending from the Y-decoder across the memory bank in the column direction, and a plurality of connection lines.

17 Claims, 18 Drawing Sheets

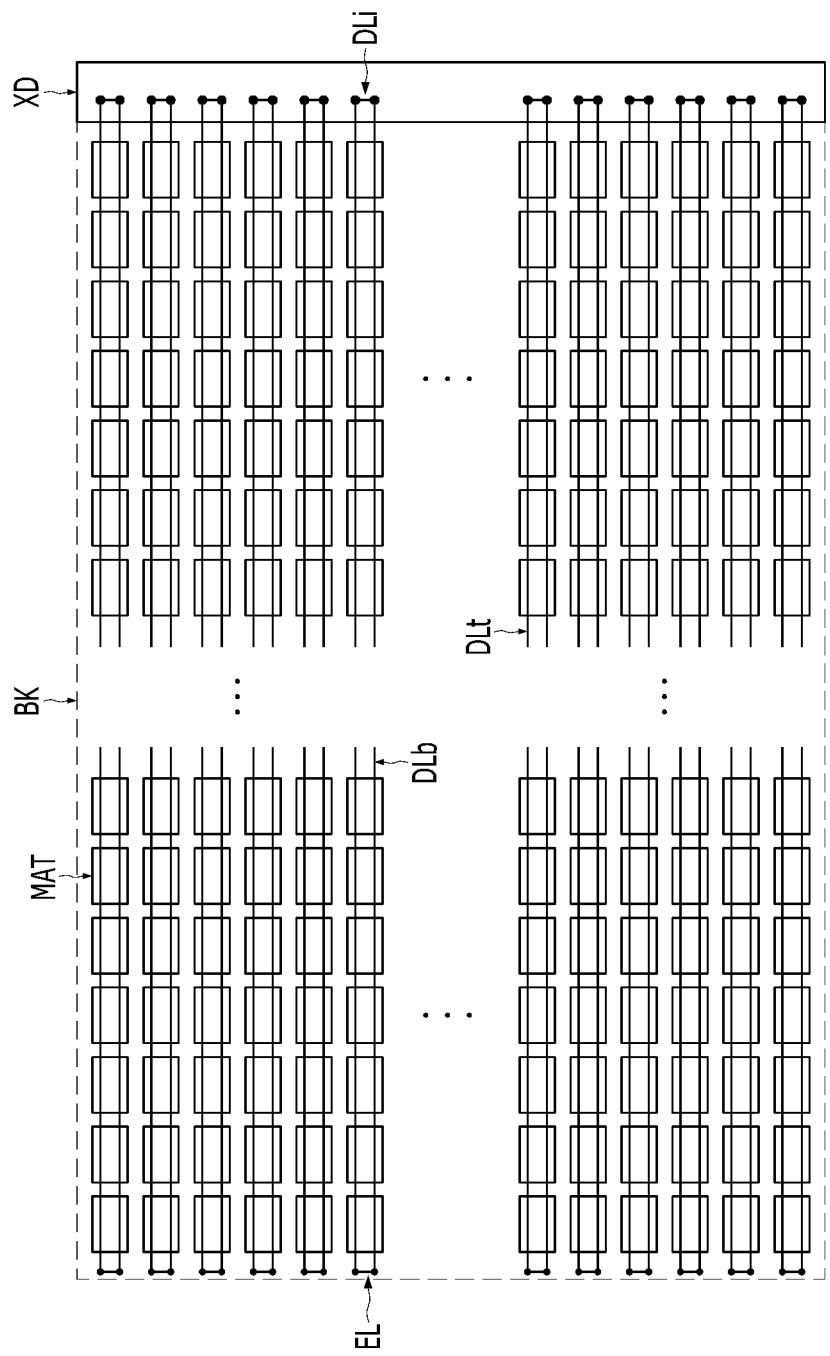

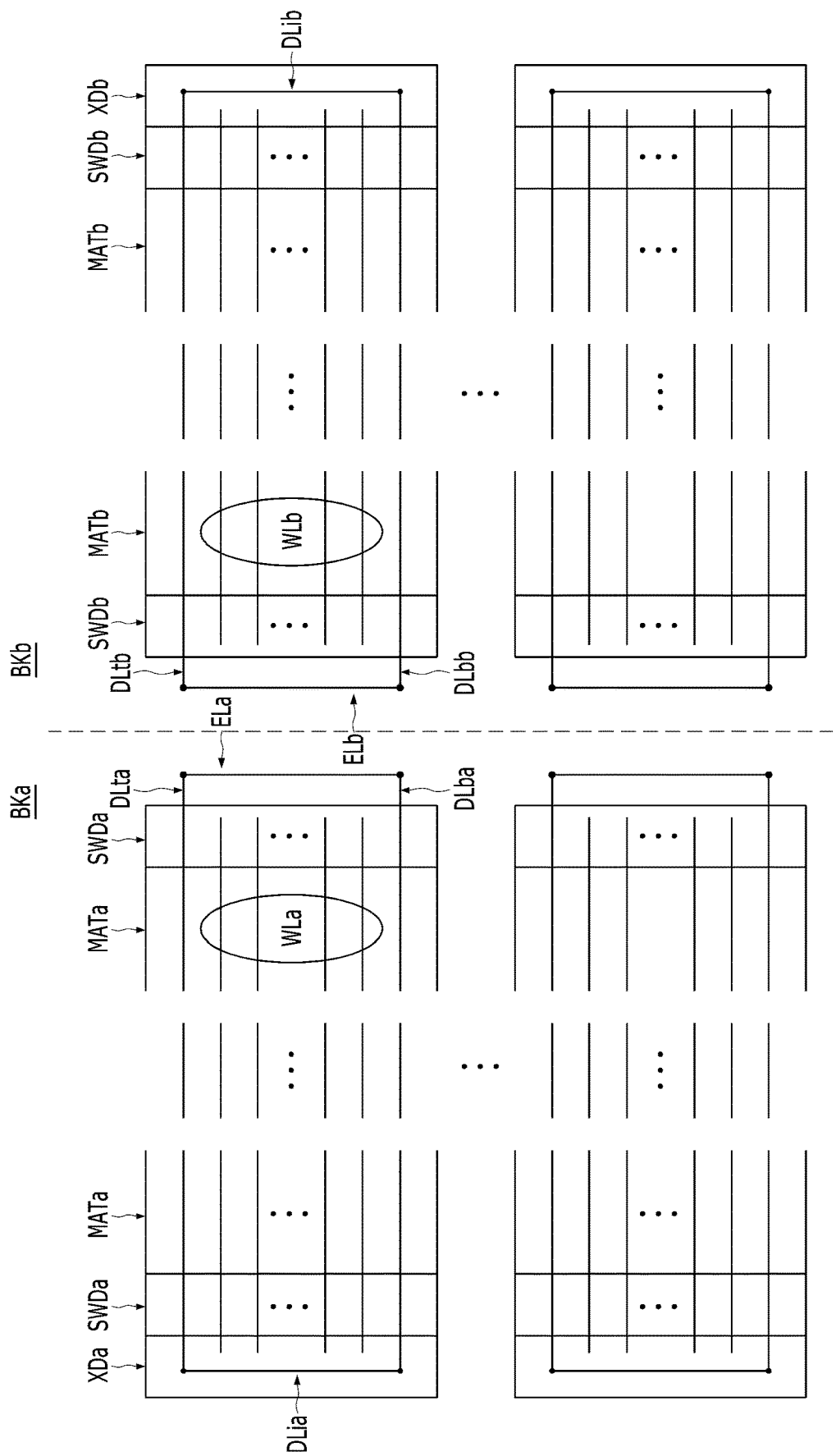

SEMICONDUCTOR DEVICE HAVING DUMMY LINES ELECTRICALLY CONNECTED WITH EACH OTHER

CROSS-REFERENCE TO RELATED APPLICATION

This application claims priority under 35 U.S.C. § 119(a) to Korean Patent Application No. 10-2021-0017532 filed on Feb. 8, 2021 in the Korean Intellectual Property Office, which is incorporated herein by reference in its entirety.

BACKGROUND

1. Technical Field

Embodiments of the present disclosure include semiconductor devices having dummy lines electrically connected with each other.

2. Related Art

As the degree of integration of semiconductor devices increases, interconnections are becoming finer. Fine interconnections are prone to disconnections or shorts from physical and electric shocks.

SUMMARY

A semiconductor device may include a memory bank, an X-decoder adjacent to the memory bank in a row direction, an Y-decoder adjacent to the memory bank in a column direction, X-lines extending from the X-decoder across the memory bank in the row direction, Y-lines extending from the Y-decoder across the memory bank in the column direction, and a plurality of connection lines. The memory bank may include a plurality of cell mats arranged in a matrix of a plurality of rows and a plurality of columns, a plurality of sub word line drivers disposed between the plurality of cell mats in the plurality of row lines, and a plurality of bit line sense amplifiers disposed between the plurality of cell mats in the plurality of columns. The X-lines may include a dummy line pair and word lines, and lines in the dummy line pair and the word lines extend in the row direction and traverse the cell mats and the sub word line drivers disposed in a row. The Y-lines may include bit lines that traverse the cell mats and the bit line sense amplifiers in the column direction. The plurality of connection lines may include an edge connection line electrically connecting at least the lines of one of the dummy line pairs with each other in an edge area of the memory bank.

A semiconductor device may include a first memory bank, a first X-decoder adjacent to the first memory bank in a row direction, first X-lines extending from the first X-decoder across the first memory bank in the row direction, and a first edge connection line disposed in an edge area of the first memory bank. The first memory bank may include a plurality of first cell mats and a plurality of first sub word line drivers alternately arranged in the row direction. The first X-lines that extend across a row of a plurality of first cell mats and a plurality of first sub word line drivers alternately arranged may include a first upper dummy line, a first lower dummy line, and first word lines disposed between the first upper dummy line and the first lower dummy line. The first edge connection line may electrically connect the first upper dummy line to the first lower dummy line.

A semiconductor device may include a memory bank, an X-decoder adjacent to the memory bank in a row direction, X-lines extending from the X-decoder across the memory bank in the row direction, and a connection line. The memory bank may include a plurality of cell mats and a plurality of sub word line drivers alternately arranged in the row direction. The X-lines may include an upper dummy line, a lower dummy line, and a plurality of word lines disposed between the upper dummy line and the lower dummy line, the upper dummy line, the lower dummy line, and the plurality of word lines traverse a row of the cell mats and the sub word line drivers alternately arranged in the row direction. The connection line may include an inner connection line electrically connecting the upper dummy line to the lower dummy line in the X-decoder.

BRIEF DESCRIPTION OF THE DRAWINGS

FIGS. 6A to 6D are block diagrams illustrating that dummy lines are electrically connected to each other.

FIG. 7 is a block diagram illustrating an arrangement of dummy lines of two memory banks adjacent to each other in the row direction.

DETAILED DESCRIPTION

Embodiments of the present disclosure provide semiconductor devices in which defects due to disconnection of dummy lines are prevented and alleviated by electrically connecting the dummy lines.

Figure 1:
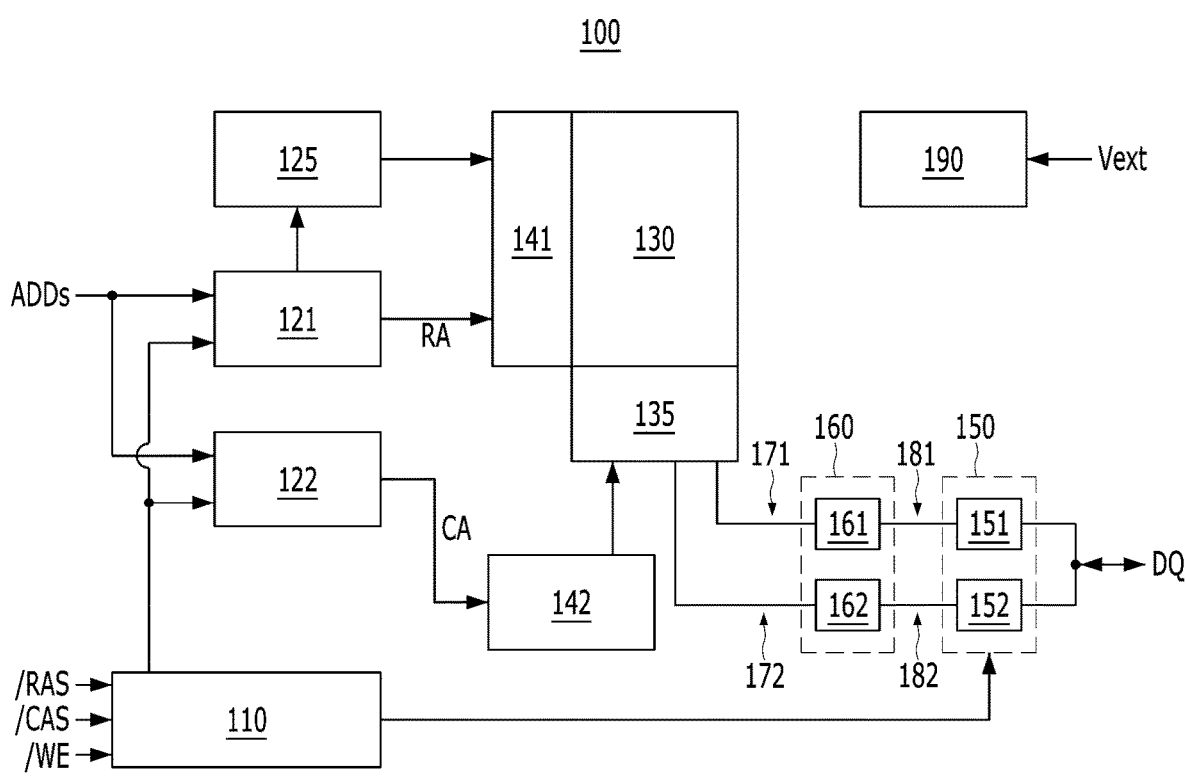
FIG. 1 is a block diagram schematically illustrating a semiconductor device according to an embodiment disclosed by the present document.

FIG. 1 is a block diagram schematically illustrating a semiconductor device according to an embodiment disclosed by the present document. Referring to FIG. 1, a semiconductor device 100 according to an embodiment of the present invention may include a command buffer 110, a row address buffer 121, a column address buffer 122, a refresh control unit 125, a memory array 130, a sense amplifier 135, a row decoder 141, a column decoder 142, a data input/output buffer 150, a data input/output circuit 160, a data input/output lines 171 and 172, data buses 181 and 182, and a voltage generator 190.

The command buffer 110 may generate various internal command signals based on external command signals provided from an external element or system. For example, the external command signals may include a row address strobe signal (/RAS), a column address strobe signal (/CAS), and a write enable signal (/WE). The command buffer 110 may provide signals for operating the row address buffer 121, the column address buffer 122, and the data input/output buffer 150 based on external command signals.

The row address buffer 121 and the column address buffer 122 may receive address signals ADDs from the external system. The address signals ADDs may include information on word lines and bit lines to be activated to access memory cells. The row address buffer 121 may provide a row address signal RA based on the address signals ADDs to the row decoder 141 and the refresh control unit 125. The column address buffer 122 may provide a column address signal CA based on the address signals ADDS to the column decoder 142.

The memory array 130 may include a plurality of memory cells for storing data. The refresh control unit 125 may count and control a refresh operation of the memory cells in the memory array 130.

The sense amplifier 135 may amplify the data. For example, in a data input mode, the sense amplifier 135 may amplify the data provided from the data input/output circuit 160 and provide the amplified data to the memory cells in the memory array 130. In a data output mode, the sense amplifier 135 may sense and amplify the data stored in the memory cells and provide the amplified data to the data input/output circuit 160.

The row decoder 141 may receive the row address signal RA from the row address buffer 121. The row decoder 141 may decode the row address signals and provide row select signals for activating word lines to the memory array 130.

The column decoder 142 may receive the column address signal CA from the column address buffer 122. The column decoder 142 may provide column selection signals, to the sense amplifier 135, for activating the bit lines by decoding the column address signal CA.

The data input/output buffer 150 may include a data input buffer 151 and a data output buffer 152. The data input buffer 151 may provide data DQ provided from the external system to the data input/output circuit 160. The data output buffer 152 may provide the data DQ provided from the data input/output circuit 160 to the external system.

The data input/output circuit 160 may include a data input circuit 161 and a data output circuit 162. The data input circuit 161 may provide the data received from the data input buffer 151 to the sense amplifier 135. The data output circuit 162 may provide the data provided from the sense amplifier 135 to the data output buffer 152.

The data input/output lines 171 and 172 may include a data input line 171 and a data output line 172. The data input line 171 may transfer data between the data input circuit 161 and the sense amplifier 135. The data output line 172 may transfer data between the sense amplifier 135 and the data output circuit 162.

The data buses 181 and 182 may connect the data input/output buffer 150 and the data input/output circuit 160. The data buses 181 and 182 may include a data input bus 181 and a data output bus 182. The data input bus 181 may connect the data input buffer 151 and the data input circuit 161. The data output bus 182 may connect the data output buffer 152 and the data output circuit 162.

The voltage generator 190 may receive an external voltage Vext and may generate and provide various internal voltages to various components of the semiconductor device 100. For example, the internal voltages may include a boosted voltage (VPP), a bulk voltage (VBB), a reference voltage (Vref), or various other internal voltages.

Figure 2A:
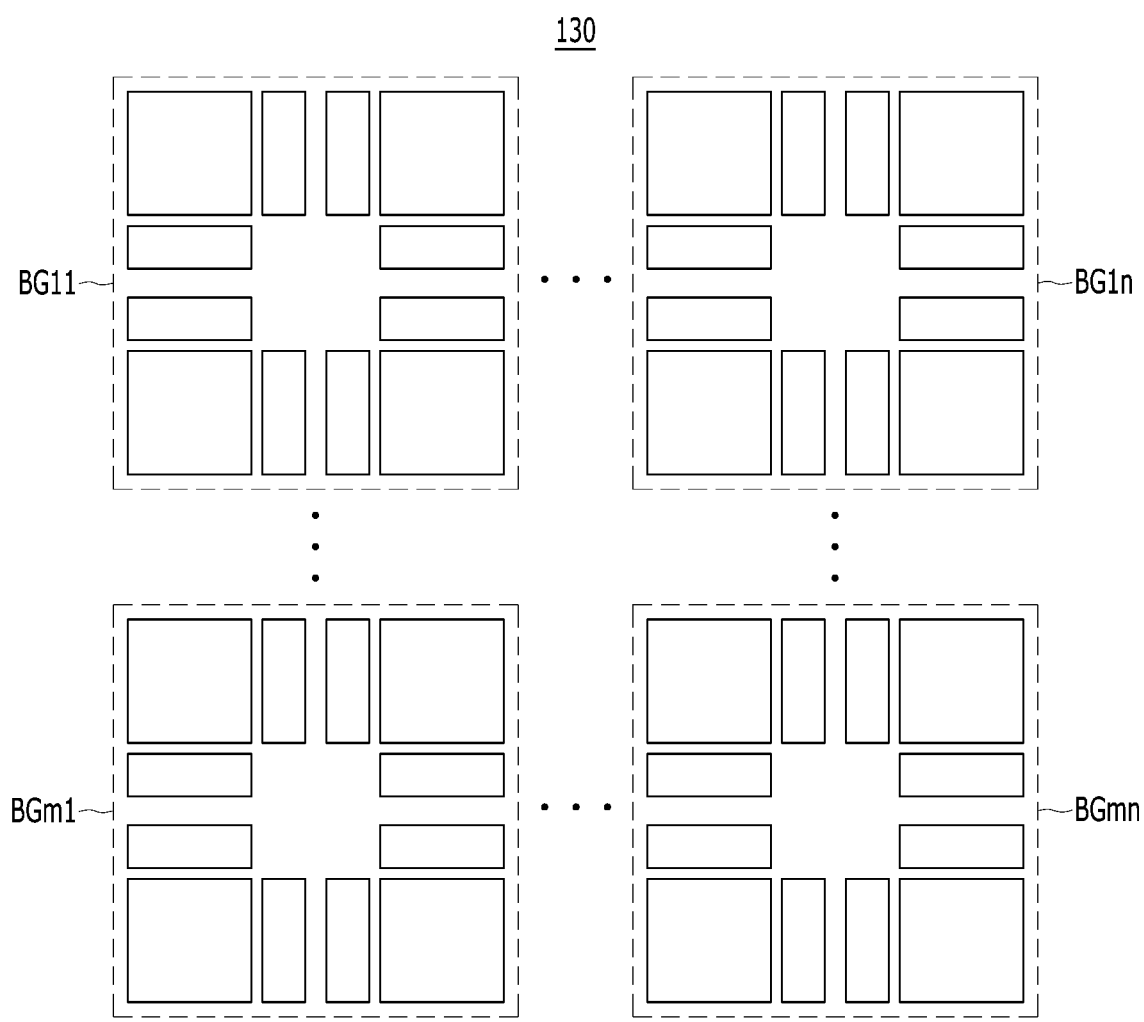
FIG. 2A is a block diagram schematically illustrating a memory array of FIG. 1.

FIG. 2A is a block diagram schematically illustrating a memory array of FIG. 1. Referring to FIG. 2A, the memory array 130 may include a plurality of memory bank groups BG11 to BGmn (where m and n are natural numbers) arranged in a matrix form or layout.

Figure 2B:
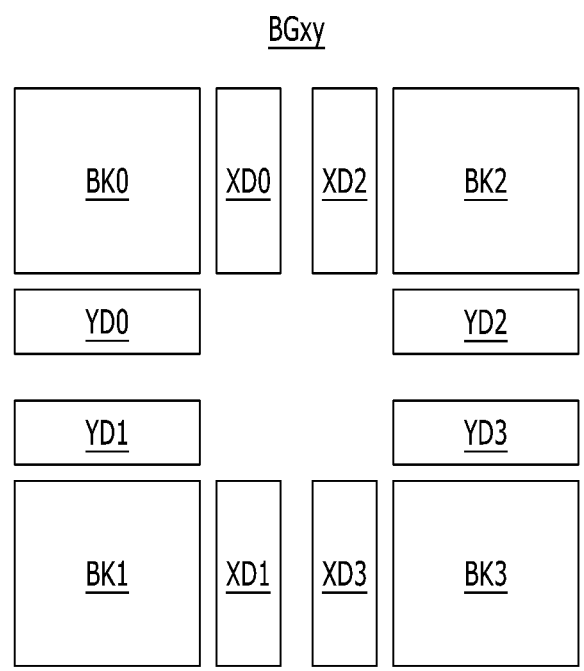
FIG. 2B is an enlarged block diagram of one of the memory bank groups of FIG. 2A.

FIG. 2B is an enlarged block diagram of one of the memory bank groups of FIG. 2A. Referring to FIG. 2B, a memory bank group BGxy may include a plurality of memory banks BK0 to BK3 arrayed in a matrix form, a plurality of X-decoders XD0 to XD3 respectively adjacent to a corresponding lateral side of the memory banks BK0 to BK3, and a plurality of Y-decoders YD0 to YD3 respectively adjacent to a corresponding upper side or lower side of the memory banks BK0 to BK3. For example, the memory banks BK0 to BK3, the X-decoders XD0 to XD3, and the Y-decoders YD0 to YD3 may be arranged symmetrically to have vertically and/or horizontally mirrored shapes. Sense amplifiers and input/output pads (not illustrated) may be further disposed between the Y-decoders YD0 to YD3. In an embodiment, the sense amplifiers and the input/output pads may be disposed in at least one of an edge area of the memory bank group BGxy, an edge area of the memory array 130, or an edge area of a chip. Therefore, in the drawing, the sense amplifiers and the input/output pads are omitted for the sake of clarity.

Figure 3:
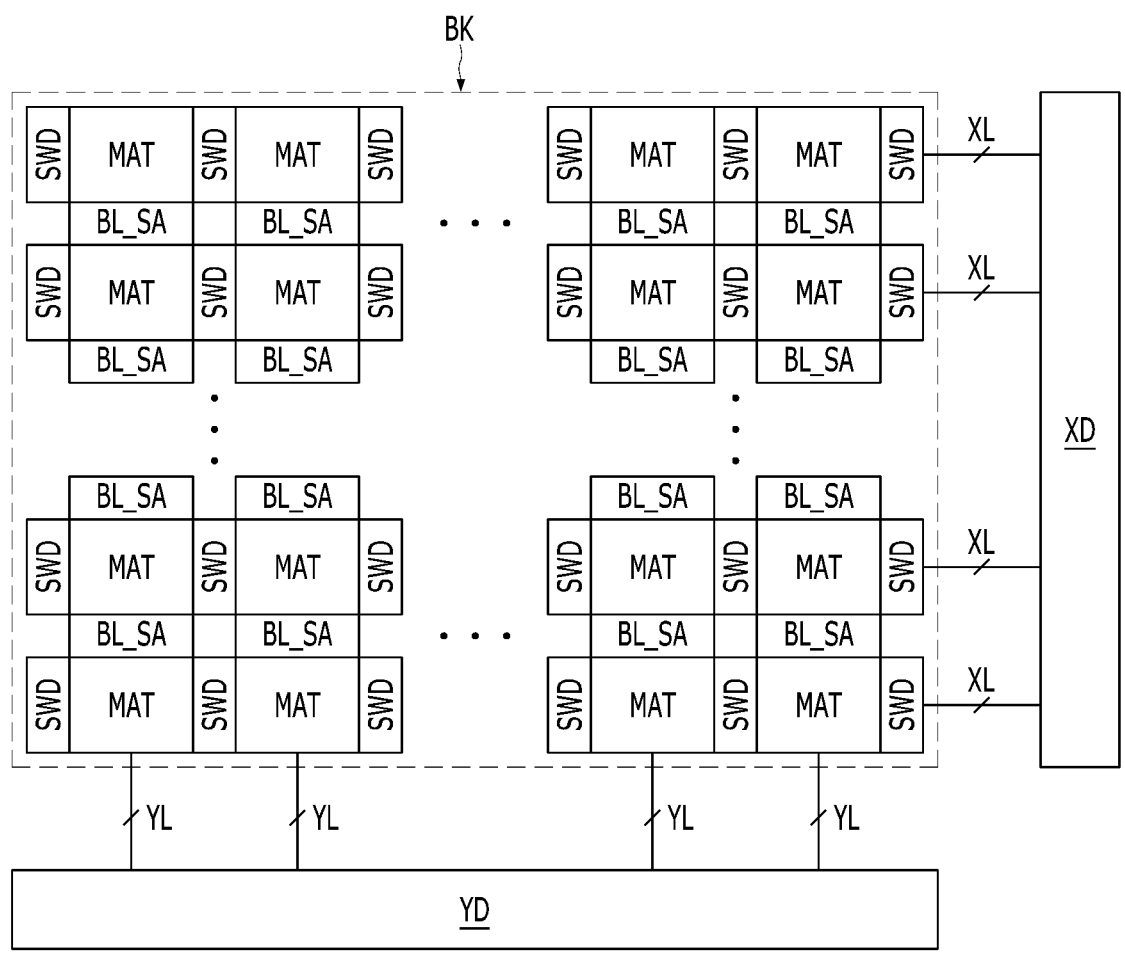
FIG. 3 is a block diagram schematically illustrating an arrangement of cell mats, sub-word line drivers, and bit line sense amplifiers in a memory bank of a semiconductor device according to an embodiment of the present document.

FIG. 3 is a block diagram schematically illustrating an arrangement of cell mats, sub-word line drivers, and bit line sense amplifiers in a memory bank of a semiconductor device according to an embodiment of the present document. Referring to FIG. 3, a memory bank BK of a semiconductor device 100 according to an embodiment of the present disclosure may include a plurality of cell mats MAT arrayed in a matrix form, a plurality of sub-word line drivers SWD disposed adjacent to the cell mats MAT in a row direction, and a plurality of bit line sense amplifiers BL_SA disposed adjacent to the cell mats MAT in a column direction. The cell mats MAT and the sub word line drivers SWD may be alternately arranged, side-by-side, in the row direction. The cell mats MAT and the bit line sense amplifiers BL_SA may be alternately arranged, side-by-side, in the column direction.

The X-decoder XD may be disposed adjacent to one side of the memory bank BK in the row direction. A plurality of X-lines XL may extend from the X-decoder XD to the memory bank BK. The cell mats MAT may each include a plurality of memory cells (not illustrated) that are arrayed in a matrix form. The sub word line drivers SWD may receive a main word line enable signal from the X-decoder XD through the X-lines XL. The sub word line drivers SWD may distribute and provide a sub word line enable signal to the memory cells in each cell mat MAT using an internal sub word line drive circuit (not illustrated). The sub word line enable signal may be a signal modulated from the main word line enable signal by the sub word line driving circuit, which is disposed in the sub word line driver.

The Y-decoder YD may be disposed adjacent to one side (e.g., a lower side) of the memory bank BK in the column direction. A plurality of Y-lines YL may extend from the Y-decoder YD to the memory bank BK. The Y-lines YL may include bit lines. The bit lines may include local bit lines and global bit lines. For example, the local bit lines may electrically connect the memory cells in the cell mats MAT to the bit line sense amplifiers BL_SA, and the global bit lines may electrically connect the bit line sense amplifiers BL_SA to the Y-decoder YD. The bit line sense amplifiers BL_SA may sense and amplify data stored in the memory cells in the cell mats MAT.

Figure 4:
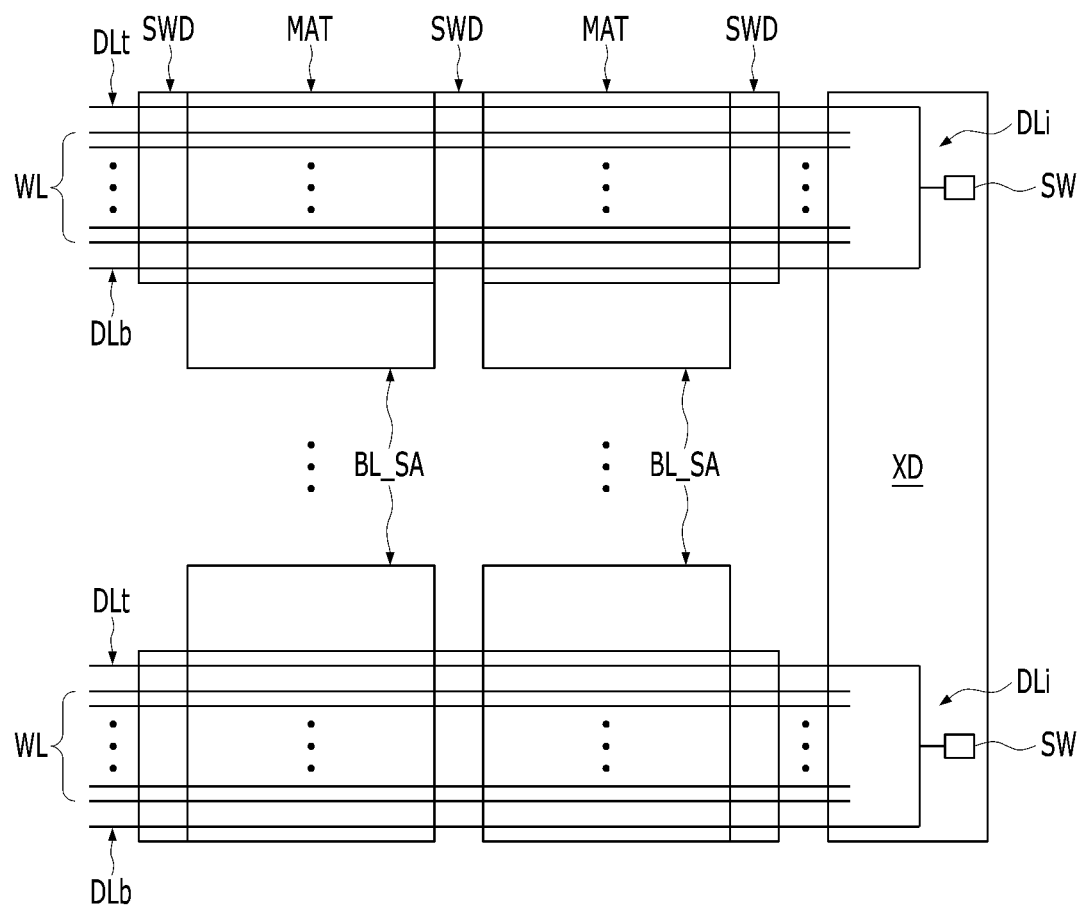
FIGS. 4 and 5 are block diagrams schematically illustrating an arrangement of word lines and dummy lines in the memory bank BK.
Figure 5:
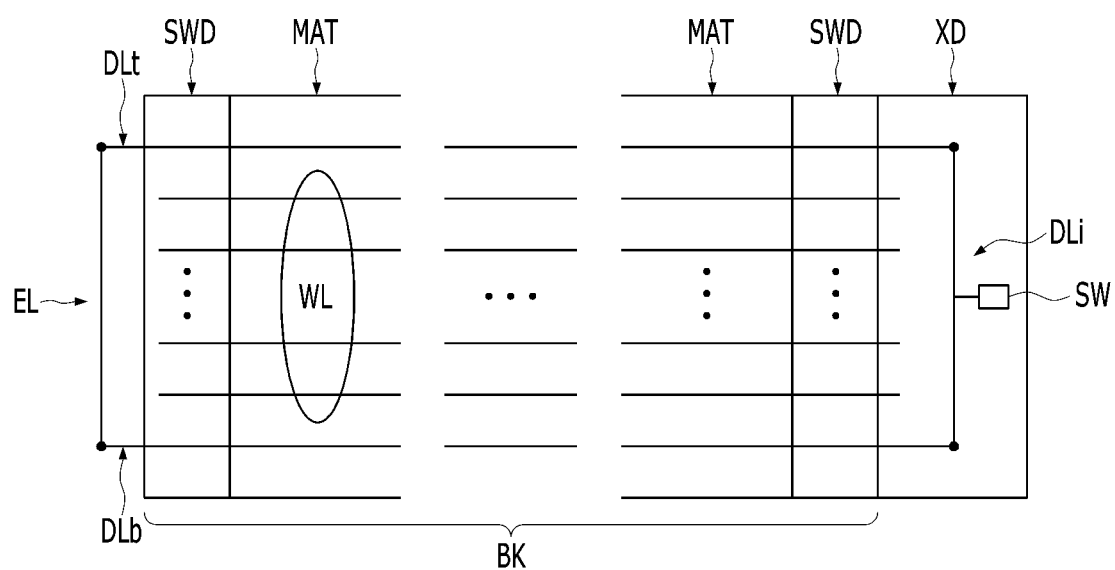

FIGS. 4 and 5 are block diagrams schematically illustrating an arrangement of word lines and dummy lines in a memory bank. Referring layouts in FIGS. 4 and 5, a pair of dummy lines DLt and DLb and a plurality of word lines WL are arranged in a column direction and may extend in parallel in a row direction. The dummy lines DLt and DLb and the word lines WL may traverse the sub word drivers SWD and the cell mats MAT, which are arranged in the row direction. The pair of dummy lines DLt and DLb may include an upper dummy line DLt and a lower dummy line DLb. The word lines WL may be disposed between the upper dummy line DLt and the lower dummy line DLb. That is, the X-lines XL of FIG. 3 may include the upper dummy lines DLt, the lower dummy lines DLb, and the word lines WL between the upper dummy lines DLt and the lower dummy lines DLb. For example, in each group of X-lines including an upper dummy line DLt, a corresponding lower dummy line DLb, and word lines WL disposed in between the dummy lines, the upper dummy line DLt may be disposed at the top of the word lines WL in the column direction. The lower dummy lines DLb may be disposed at the bottom of the word lines WL in the column direction. Groups of X-lines may traverse rows of cell mats MAT and the sub word line drivers SWD, respectively, that are alternately arranged in the row direction.

The word lines WL may include main word lines and sub word lines. The main word lines may transfer the main word line enable signals from the X-decoder XD to the sub word line drivers SWD, and the sub word lines may transfer the sub word line enable signals from the sub word line drivers SWD to the memory cells in the cell mats MAT. Although the figures illustrate one word line WL passing through all of the sub word line drivers SWD and cell mats MAT from the X-decoder XD, the illustrated word lines WL may include the main word lines and sub word lines. For example, in a layout, the main word lines might not traverse or pass the inner areas of the cell mats MAT, and the sub word lines may traverse or pass only the inner areas of the cell mats MAT.

The upper and lower dummy lines DLt and DLb may also include upper and lower main dummy lines and upper and lower sub dummy lines, respectively. The upper and lower main dummy lines and the upper and lower sub dummy lines may have the same configuration as the main word lines and the sub word lines, respectively. For example, the upper and lower main dummy lines may transfer main dummy signals from the X-decoder XD to the sub word line drivers SWD, and the upper and lower sub dummy lines may transfer sub dummy signals from the sub word line drivers SWD to the memory cells in the cell mats MAT.

The main word lines, the upper main dummy lines, and lower main dummy lines may correspond to metal interconnections. The sub word lines, the upper sub dummy lines, and lower sub dummy lines may correspond to gate electrodes of transistors.

That is, the main word lines may perform on/off operations of the transistor. The cell mats MAT may further include dummy memory cells adjacent to edge regions. The dummy memory cells may be not used to store the data and may maintain a constant voltage level so that real memory cells can operate stably. When the upper and lower dummy lines DLt and DLb, are floated, the dummy memory cells may be coupled with the adjacent real memory cells so that voltage levels of the upper and lower dummy lines DLt and DLb and the adjacent real memory cells may rise, and the data stored in the real memory cells may be lost. Therefore, a bulk bias voltage or a back bias voltage may always be applied to the upper and lower dummy lines DLt and DLb to avoid data loss.

The plurality of word lines WL, upper dummy lines DLt, and lower dummy lines DLb may be electrically connected to the X-decoder XD. In the X-decoder XD, first ends of a pair of dummy lines DLt and DLb may be electrically connected to each other through an inner connection line DLi. The pair of dummy lines DLt and DLb may be commonly connected to each other to share a common switch circuit SW. The common switch circuit SW may include a transistor circuit. For example, the pair of dummy lines DLt and DLb may be turned on and turned off by the common switch circuit SW at the same time or simultaneously.

In the edge region of the memory bank BK, second ends of the pair of dummy lines DLt and DLb may be electrically connected to each other through an edge connection line EL. For example, the edge connection line EL may extend in the column direction to electrically connect the upper dummy line DLt to the lower dummy line DLb. The edge connection line EL may be disposed in the memory bank BK. In an embodiment, the edge connection line EL may be disposed to be vertically overlapped the sub word line driver SWD in a layout. In another embodiment, the edge connection line EL may be disposed outside the memory bank BK. The inner connection line DLi and the edge connection line EL may correspond to metal wiring.

Figure 6B:
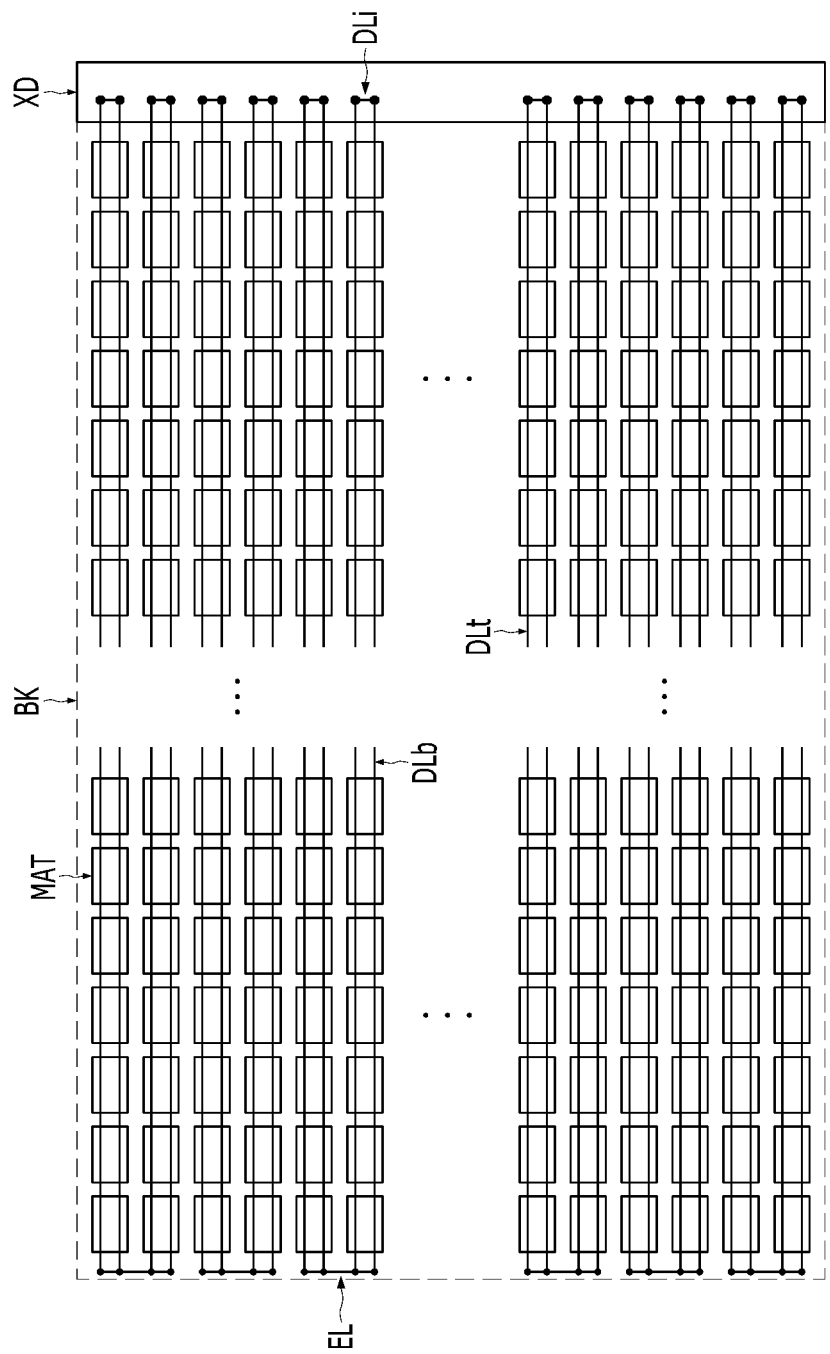
Figure 6C:
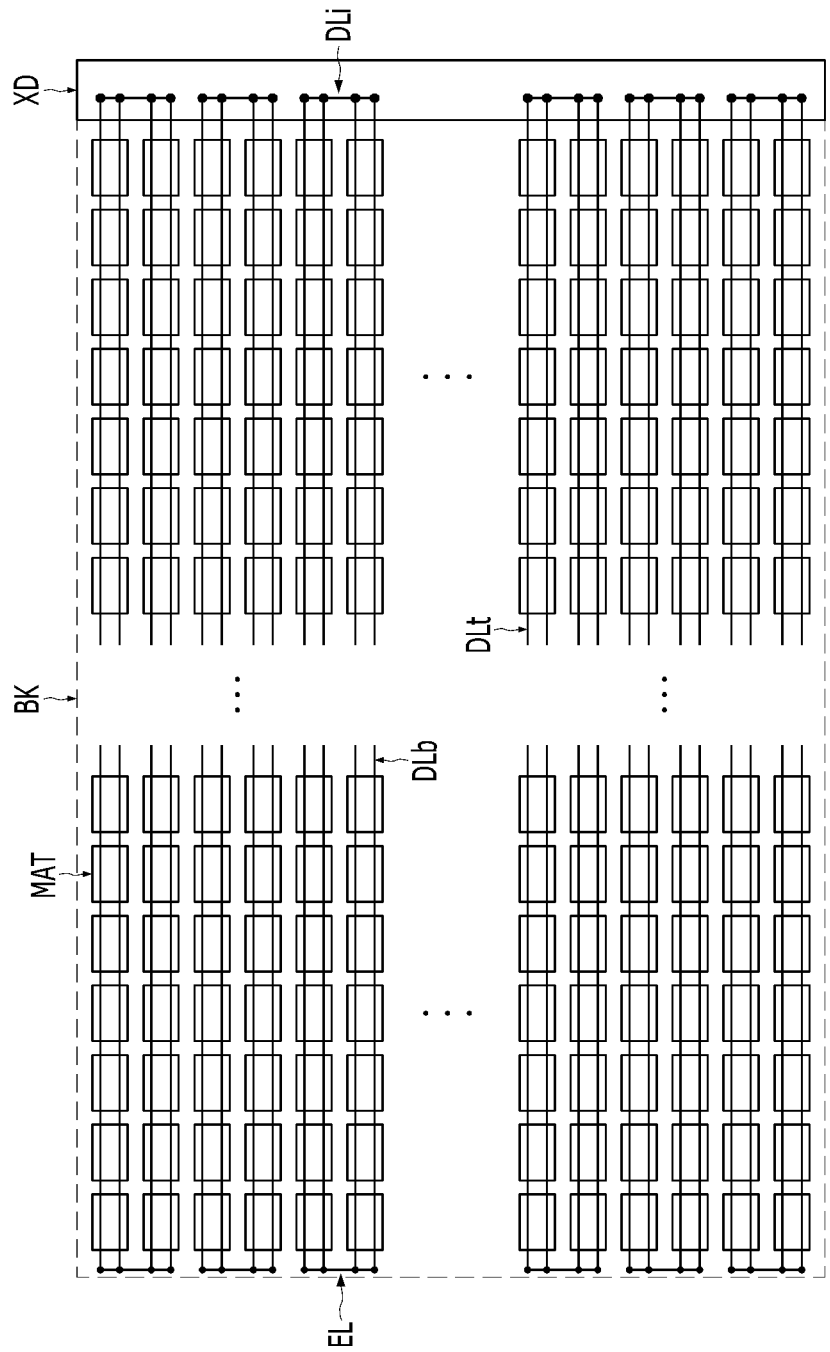

FIGS. 6A to 6D are block diagrams illustrating dummy lines electrically connected to each other. Referring to FIGS. 6A to 6C, a memory bank BK may include a plurality of cell mats MAT arrayed in a matrix form and upper dummy lines DLt and lower dummy lines DLb. Pairs of upper dummy lines DLt and lower dummy lines DLb respectively traverse the cell mats MAT that are disposed on the same rows. For example, a pair of the upper dummy line DLt and the lower dummy line DLb may commonly traverse the cell mats MAT that are side-by-side in the row direction, and the sub word line drivers SWD may be omitted.

Referring to FIG. 6A, first ends of a pair of dummy lines DLt and DLb commonly across the cell mats MAT disposed on the same row may be electrically connected to each other through the inner connection line DLi in the X-decoder XD, and second ends of the pair of dummy lines DLt and DLb may be electrically connected to each other through the edge connection line EL in the edge region of the memory bank BK. For example, the upper dummy line DLt and the lower dummy line DLb that commonly traverse the cell mats MAT and the sub word line drivers SWD disposed on the same row may be electrically connected to each other in a closed-loop shape. The arrangement of the upper dummy line DLt and the lower dummy line DLb may be repeated in other rows of cell mats MAT.

Referring to FIG. 6B, compared with FIG. 6A, the edge connection lines EL may further electrically connect the pairs of dummy lines DLt to DLb that are disposed on adjacent rows. That is, the edge connection lines EL may electrically connect two or more pairs of dummy lines DLt and DLb disposed on two or more rows to each other. The inner connection lines DLi in the X-decoder XD may electrically connect only one pair of dummy lines DLt and DLb that are disposed on the same row of cell mats MAT.

Referring to FIG. 6C, in comparison with FIG. 6B, the inner connection lines DLi in the X-decoder XD may further electrically connect two or more pairs of dummy lines DLt and DLb disposed on two or more adjacent rows of cell mats MAT.

Figure 6D:
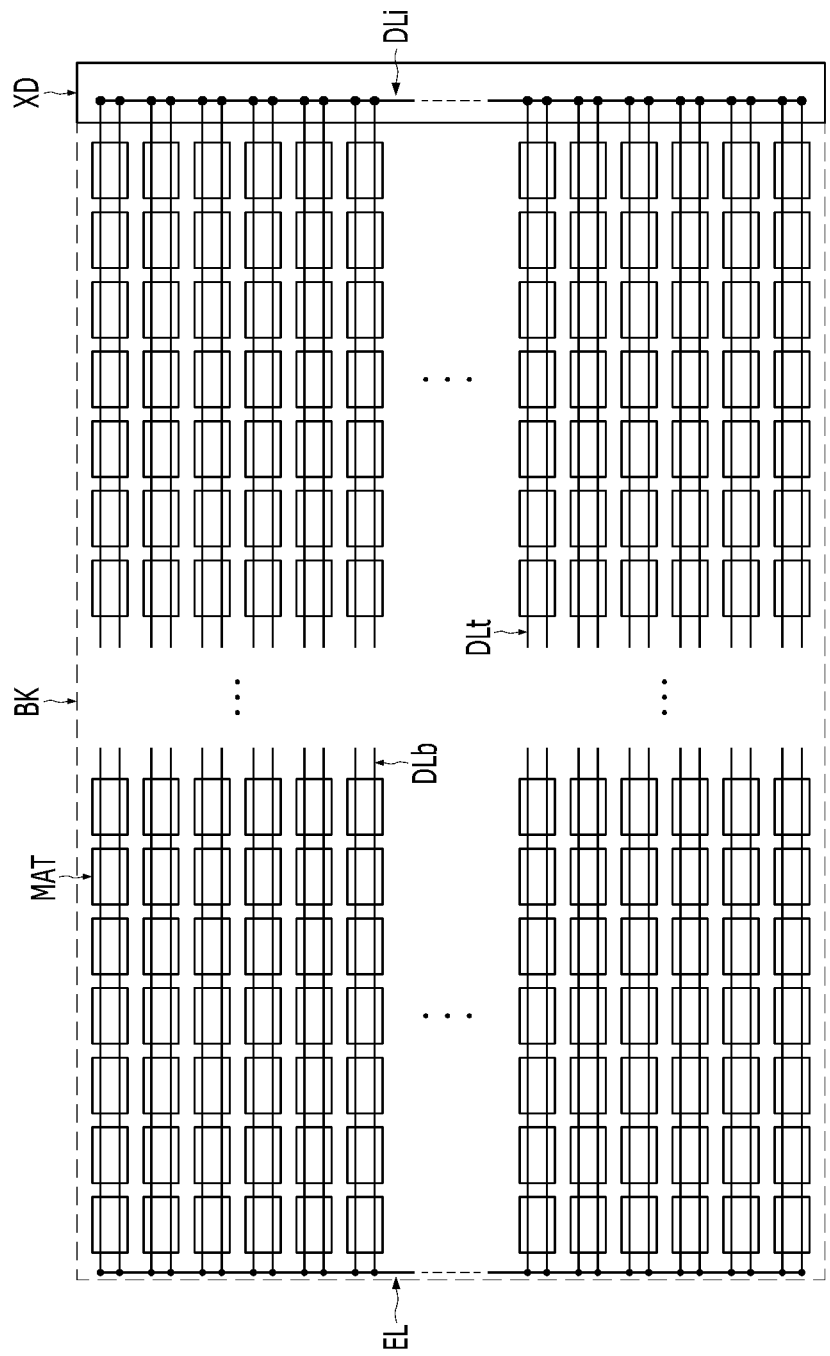

Referring to FIG. 6D, compared to FIGS. 6A to 6C, the inner connection lines DLi and the edge connection lines EL may electrically connect all dummy lines DLt and DLb in a memory bank BK to each other.

In an embodiment, in the X-decoder XD, the inner connection lines DLi may only electrically connect dummy lines DLt and DLb disposed on the same row to each other, in the edge region, the edge connection lines EL may electrically connect all dummy lines DLt and DLb in a memory bank BK to each other.

In an embodiment, in the X-decoder XD, the inner connection lines DLi may electrically connect all dummy lines DLt and DLb in the memory bank BK to each other, in the edge region, the edge connection lines EL may electrically connect only dummy lines DLt and DLb disposed on the same row to each other.

Referring again to FIGS. 6B and 6C, in an embodiment, the inner connection lines DL and the edge connection lines EL may electrically connect different numbers of pairs of dummy lines DLt and DLb disposed on a plurality of adjacent rows to each other, respectively. That is, the inventive concepts of the embodiments illustrated in FIGS. 6A to 6D may be variously combined.

FIG. 7 is a block diagram illustrating an arrangement of dummy lines of two memory banks adjacent to each other in the row direction. Referring to FIG. 7, two memory banks BKa and BKb are adjacent to each other in the row direction. The two memory banks BKa and BKb may be symmetrical to each other or mirror each other in the row direction. For example, first and second cell mats MATa and MATb, first and second sub word line drivers SWDa and SWDb, first and second X-decoders XDa and XDb, first and second word lines WLa and WLb, first and second upper dummy lines DLta and DLtb, first and second lower dummy lines DLba and DLbb, inner connection lines DLia and DLib, and edge connection lines ELa and ELb, respectively located in the first and second memory banks BKa and BKb adjacent to each other, may have symmetrical shapes or mirrored shapes in the row direction. The first and second X-decoders XDa and XDb adjacent to respective memory banks BKa and BKb may also have a symmetrical shape or a mirrored shape in the row direction. For example, the first word lines WLa, the first upper dummy lines DLta, and the first lower dummy lines DLba of the first memory bank BKa disposed on a left side, and the second word lines WLb, the second upper dummy lines DLtb, and the second lower dummy lines DLbb of the second memory bank BKb disposed on a right side, may have symmetrical shapes or mirrored shapes. In FIG. 7, as an example, the edge regions of the first and second memory banks BKa and BKb may be adjacent to each other, with the first and second X-decoders XDa and XDb disposed to be spaced apart from each other. In another example, referring to FIG. 2B, the first and second X-decoders XDa and XDb may be adjacent to each other, and the first and second memory banks BKa and BKb may be disposed to be spaced apart from each other. A first array of first elements and a second array of second elements may have symmetrical shapes or mirrored shapes in the row direction. The first elements may include a first cell mat, a first sub word line driver, a first X-decoder, first word lines, a first dummy line, and a first connection line. The second elements may include a second cell mat, a second sub word line driver, a second X-decoder, second word lines, a second dummy line, and a second connection line.

Figure 8A:
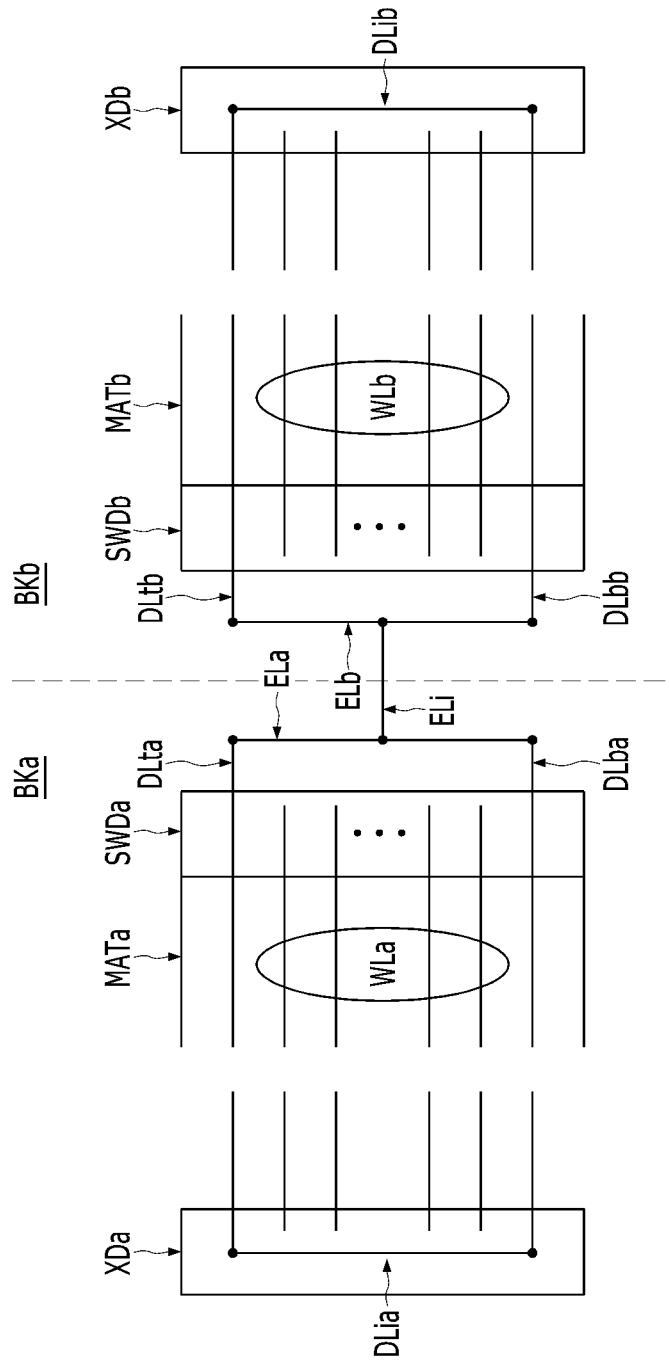
FIGS. 8A to 8C are block diagrams illustrating electrical connections of first and second dummy lines of first and second memory banks that are adjacent to each other.
Figure 8B:
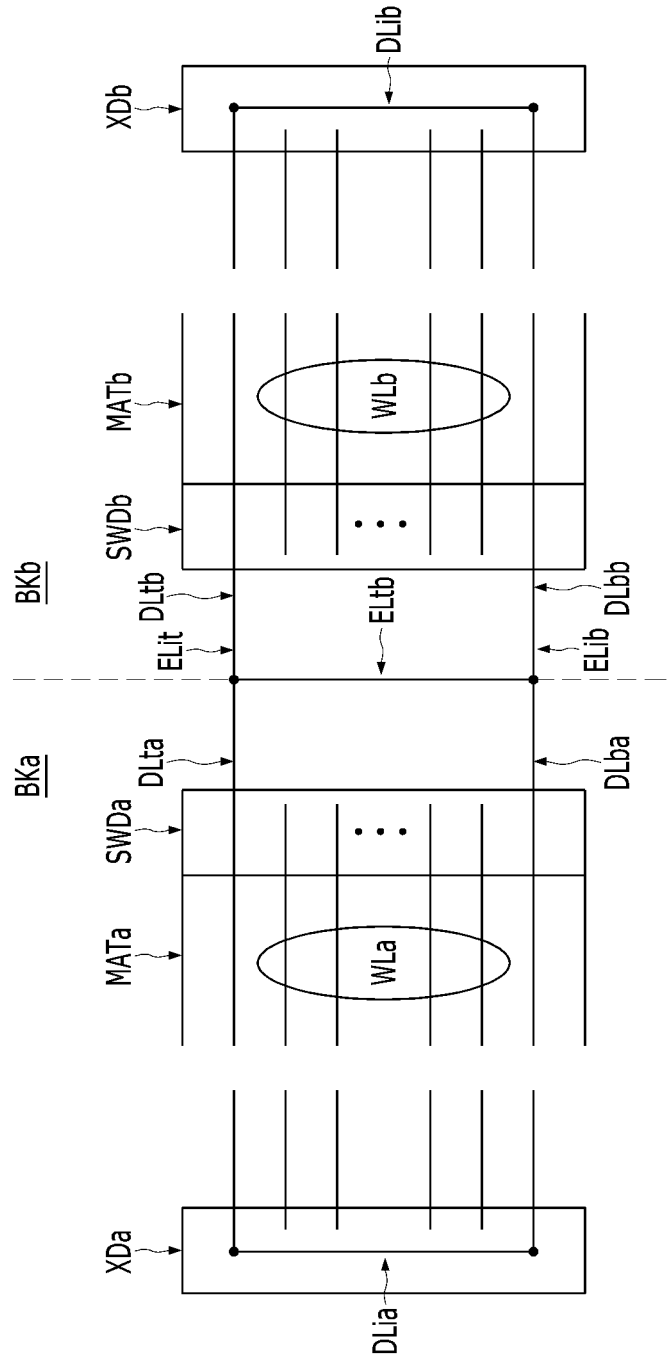
Figure 8C:
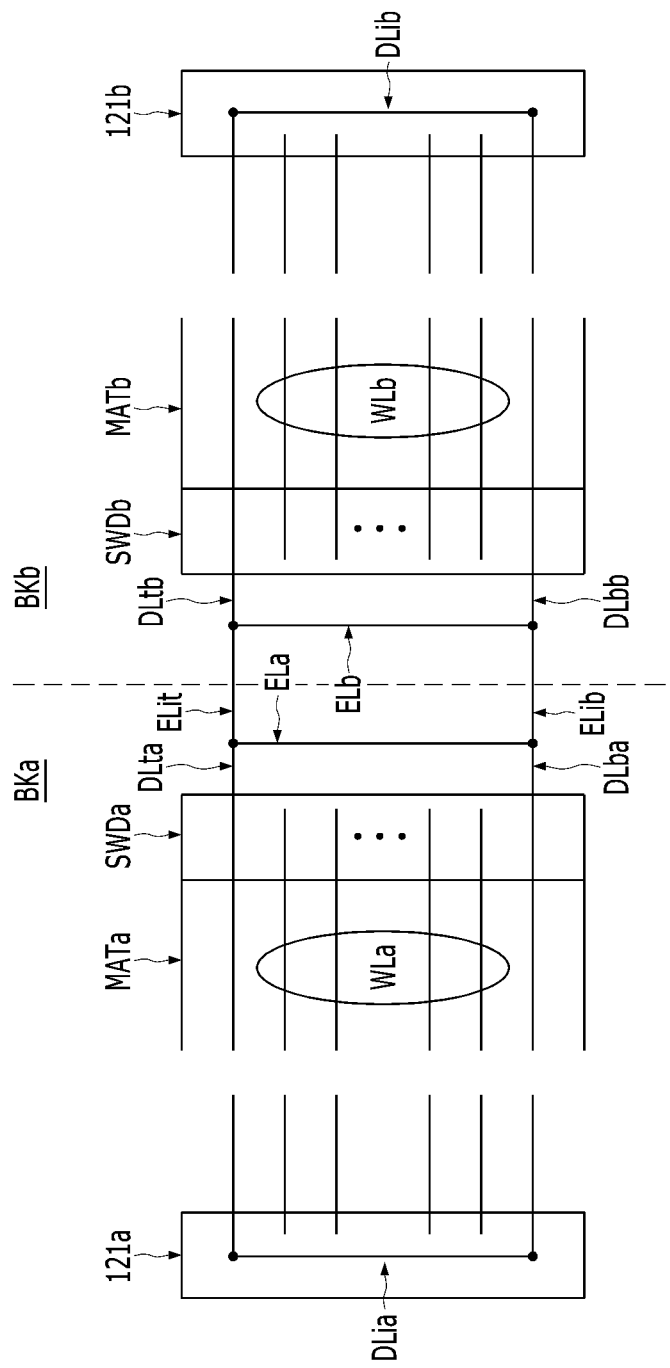

FIGS. 8A to 8C are block diagrams illustrating electrical connections of first and second dummy lines of first and second memory banks that are adjacent to each other.

Referring to FIGS. 8A and 8C, the first and second edge connection lines ELa and ELb, respectively of the first and second memory banks BKa and BKb that are adjacent to each other, may be electrically connected to each other. For example, in FIGS. 8A to 8C, the first dummy lines DLta and DLba of the first memory bank BKa on a left side and the second dummy lines DLtb and DLbb of the second memory bank BKb on a right side may be electrically connected. The first inner connection line DLia may electrically connect the first upper dummy line DLta to the first lower dummy line DLba in the first X-decoder XDa. The second inner connection line DLib may electrically connect the second upper dummy line DLtb to the second lower dummy line DLbb in the second X-decoder XDb.

Referring to FIG. 8A, first and second edge connection lines ELa and ELb of the first and second memory banks BKa and BKb, respectively, may be electrically connected to each other through an inter-bank edge connection line ELi. For example, the first edge connection line ELa of the first memory bank BKa and the second edge connection line ELb of the second memory bank BKb may be electrically connected to each other through the inter-bank edge connection line ELi.

Referring to FIG. 8B, the first and second upper dummy lines DLta and DLtb, and the first and second lower dummy lines DLba and DLbb, may be electrically connected to each other, respectively. For example, the first upper dummy line DLta of the first memory bank BKa and the second upper dummy line DLtb of the second memory bank BKb may be electrically connected to each other through an upper inter-bank edge connection line ELit, and the first lower dummy line DLba of the first memory bank BKa and the second lower dummy line DLbb of the second memory bank BKb may be electrically connected to each other through a lower inter-bank edge connection line ELib. The upper inter-bank edge connection line ELit and the lower inter-bank edge connection line ELib may be electrically connected to each other through an upper-lower edge connection line ELtb.

Referring to FIG. 8C, the first and second upper dummy lines DLta and DLtb, and the first and second lower dummy lines DLba and DLbb, may be further electrically connected to each other through the upper inter-bank edge connection line ELit and the lower inter-bank edge connection line ELib, respectively. The upper inter-bank edge connection line ELit and the lower inter-bank edge connection line ELib may be electrically connected to each other through the first edge connection line ELa of the first memory bank BKa and the second edge connection line ELb of the second memory bank BKb.

Figure 9A:
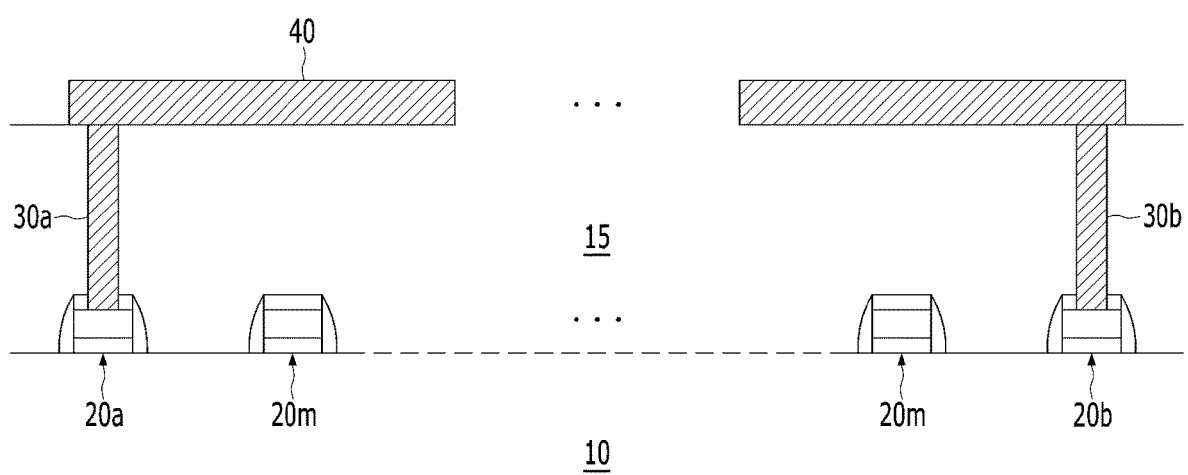
FIGS. 9A to 9D are longitudinal cross-sectional views illustrating electrical connection structures between upper dummy lines and lower dummy lines in the edge region.

FIGS. 9A to 9D are longitudinal cross-sectional views illustrating electrical connection structures between upper dummy lines and lower dummy lines in the edge region. Referring to FIG. 9A, a semiconductor device 100 may include, disposed on a substrate 10, a plurality of gates 20m, 20a, and 20b, an interlayer insulating layer 15, via plugs 30a and 30b, and a connection line 40. The substrate 10 may include a semiconducting layer such as a silicon wafer. The gates 20m, 20a, and 20b may include real gates 20m corresponding to the word lines WL, a first dummy gate 20a corresponding to the upper dummy line DLt, and a second dummy gate 20b corresponding to the lower dummy line DLb. The real gates 20m may be disposed between the first dummy gate 20a and the second dummy gate 20b. The interlayer insulating layer 15 may cover the gates 20m, 20a, and 20b on the substrate 10. The interlayer insulating layer 15 may include an insulating material such as silicon oxide. The via plugs 30a and 30b may include a first via plug 30a connected to the first dummy gate 20a and passing through the interlayer insulating layer 15, and a second via plug 30b connected to the second dummy gate 20b and passing through the interlayer insulating layer 15. The connection line 40 may be disposed on the interlayer insulating layer 15. The connection line 40 may electrically connect the first via plug 30a to the second via plug 30b. The connection line 40 may correspond to an edge connection line EL.

Figure 9B:
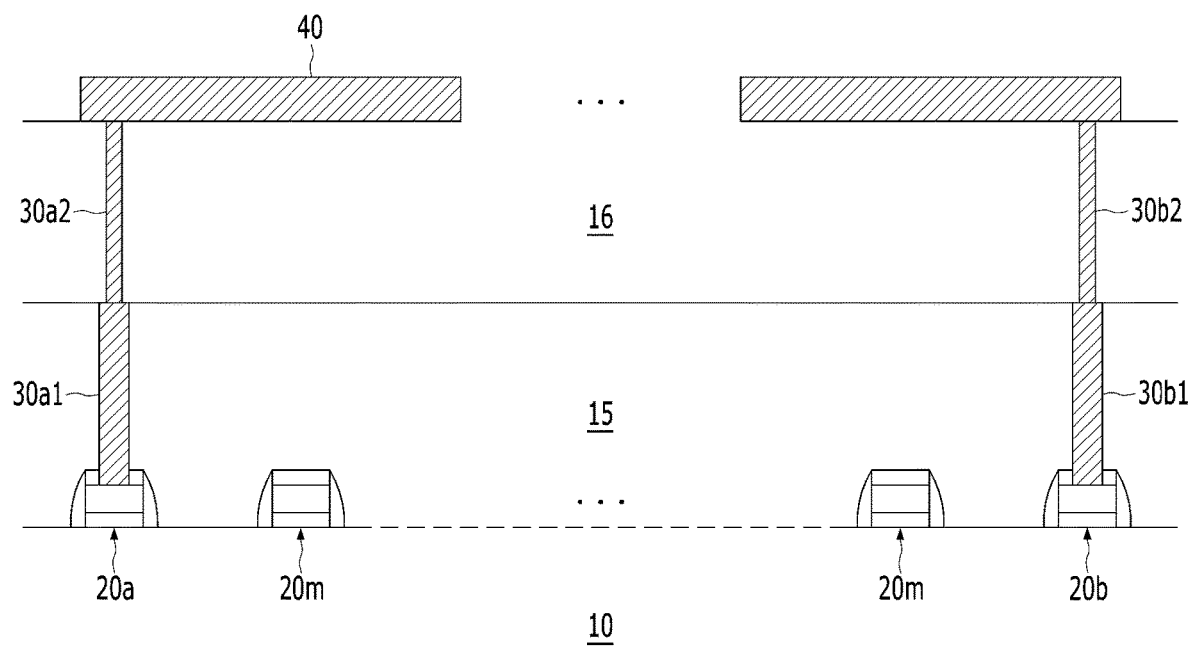

Referring to FIG. 9B, a semiconductor device 100 may include, disposed on a substrate 10, a plurality of gates 20m, 20a, and 20b, a lower interlayer insulating layer 15, an upper interlayer insulating layer 16, and via plugs 30a1, 30a2, 30b1, and 30b2, and a connection line 40. The lower interlayer insulating layer 15 and the upper interlayer insulating layer 16 may include an insulating material such as silicon oxide. The via plugs 30a1, 30a2, 30b1, and 30b2 may include a first lower via plug 30a1, a first upper via plug 30a2, a second lower via plug 30b1, and a second upper via plug 30b2. The first lower via plug 30a1 may vertically penetrate the lower interlayer insulating layer 15 to connect the first dummy gate 20a to the first upper via plug 30a2. The first upper via plug 30a2 may penetrate the upper interlayer insulating layer 16 to connect the first lower via plug 30a1 to the connection line 40. The second lower via plug 30b1 may vertically penetrate the lower interlayer insulating layer 15 to connect the second dummy gate 20b to the second upper via plug 30b2. The second upper via plug 30b2 may penetrate the upper interlayer insulating layer 16 to connect the second lower via plug 30b1 to the connection line 40. The first lower via plug 30a1 may have a greater horizontal thickness than the first upper via plug 30a2. The second lower via plug 30b1 may have a greater horizontal thickness than the second upper via plug 30b2. The first lower via plug 30a1 may be vertically aligned with the first upper via plug 30a2. The second lower via plug 30b1 may be vertically aligned with the second upper via plug 30b2. Elements not fully described in FIG. 9B may be understood with reference to FIG. 9A.

Figure 9C:
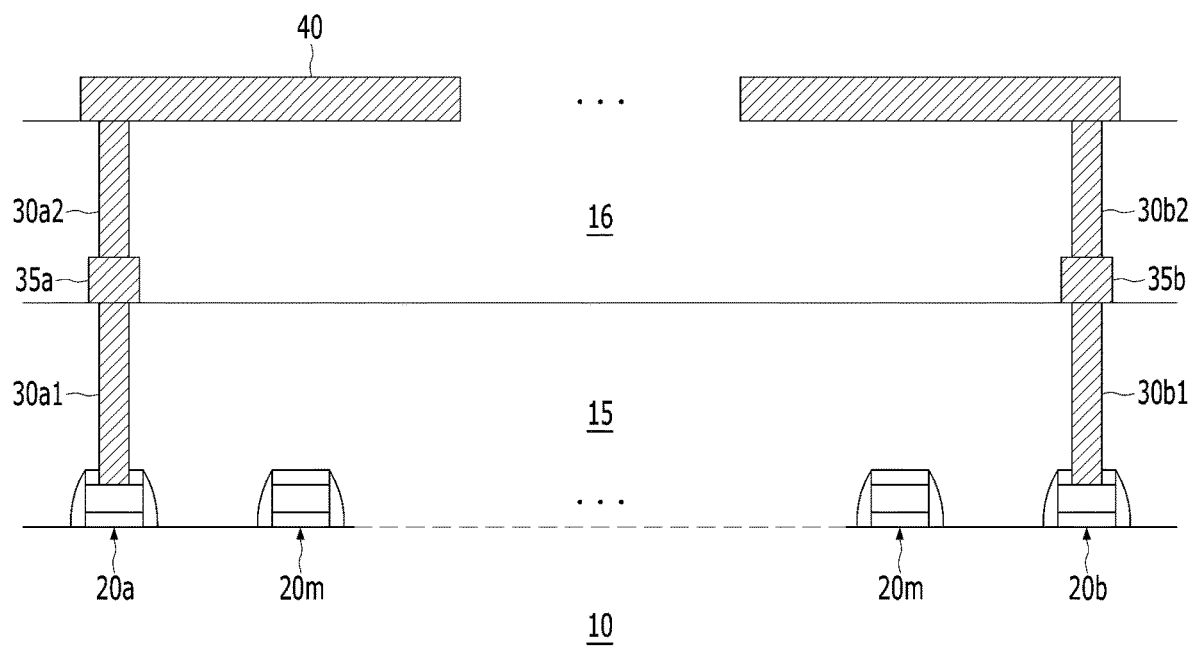

Referring to FIG. 9C, a semiconductor device 100 may include, disposed on a substrate 10, a plurality of gates 20m, 20a, and 20b, a lower interlayer insulating layer 15, an upper interlayer insulating layer 16, via plugs 30a1, 30a2, 30b1, and 30b2, via pads 35a and 35b, and a connection line 40. The via pads 35a and 35b may include a first via pad 35a disposed between the first lower via plug 30a1 and the first upper via plug 30a2, and a second via pad 35b disposed between the second lower via plug 30b1 and the upper via plug 30b2. The first and second via pads 35a and 35b may be disposed on the lower interlayer insulating layer 15. Elements not fully described in FIG. 9C may be understood with reference to FIGS. 9A and 9B.

Figure 9D:
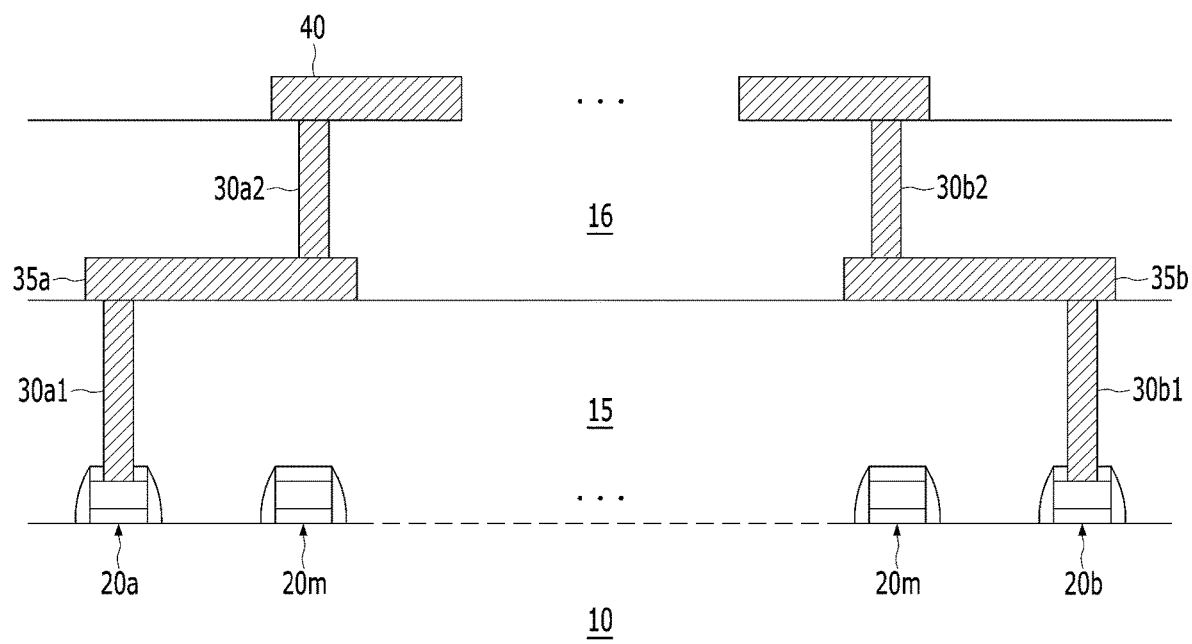

Referring to FIG. 9D, a semiconductor device 100 may include, disposed on a substrate 10, a plurality of gates 20m, 20a, and 20b, a lower interlayer insulating layer 15, an upper interlayer insulating layer 16, and via plugs 30a1, 30a2, 30b1, and 30b2, first and second via pads 35a and 35b, and a connection line 40. The first and second via pads 35a and 35b may have a horizontal segment or a bar shape. The first lower via plug 30a1 may be horizontally offset from the first upper via plug 30a2 so that the first upper and lower via plugs 30a2 and 30a1 are not vertically aligned with each other. The second lower via plug 30b1 may be horizontally offset from the second upper via plug 30b2 so that the second upper and lower via plugs 30b2 and 30b1 are not vertically aligned. Elements not fully described in FIG. 9D may be understood with reference to FIGS. 9A to 9C.

According to the embodiments of the present invention, the dummy lines may receive word line bias voltages from two directions. Accordingly, even if a portion of the dummy lines is disconnected, the dummy lines can still receive the word line bias voltage. That is, dummy lines may not be floated. Accordingly, operations of the main word lines may be stabilized, and the data input/output operations may proceed smoothly.

While this disclosure contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination and the claimed combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements, and variations can be made based on what is described and illustrated in this patent document.

What is claimed is:

1. A semiconductor device comprising:
a memory bank;
an X-decoder adjacent to the memory bank in a row direction;
a Y-decoder adjacent to the memory bank in a column direction;
X-lines extending from the X-decoder across the memory bank in the row direction;
Y-lines extending from the Y-decoder across the memory bank in the column direction; and
a plurality of connection lines,
wherein:
the memory bank includes:
a plurality of cell mats arranged in a matrix of a plurality of rows and a plurality of columns,
a plurality of sub word line drivers disposed between the plurality of cell mats in the plurality of rows, and
a plurality of bit line sense amplifiers disposed between the plurality of cell mats in the plurality of columns,
wherein:
the X-lines include a dummy line pair and word lines, and lines in the dummy line pair and the word lines extend in the row direction and traverse the cell mats and the sub word line drivers disposed in a row, and
the Y-lines include bit lines that traverse the cell mats and the bit line sense amplifiers in the column direction, and
wherein the plurality of connection lines includes:

an edge connection line that electrically connects the lines of the dummy line pair with each other in an edge area of the memory bank; and an inner connection line that connects the lines of the dummy line pair with each other in the X-decoder.

2. The semiconductor device of claim 1, wherein the dummy line pair is electrically commonly connected to a common switch circuit in the X-decoder.

3. The semiconductor device of claim 1, wherein the X-lines include a plurality of dummy line pairs, and each of the plurality of dummy line pairs includes lines that extend in the row direction across a corresponding row of cell mats, and the inner connection line electrically connects at least two pairs of the plurality of dummy line pairs in the X-decoder.

4. The semiconductor device of claim 3, wherein the inner connection line electrically connects all of the plurality of dummy line pairs with each other in the X-decoder.

5. The semiconductor device of claim 1, wherein the X-lines include a plurality of dummy line pairs and each of the plurality of dummy line pairs includes lines that extend in the row direction across a corresponding row of cell mats, and the edge connection line electrically connects at least two pairs of the plurality of dummy line pairs in the edge area of the memory bank.

6. The semiconductor device of claim 5, wherein the edge connection line electrically connects all of the plurality of dummy line pairs with each other in the edge area of the memory bank.

7. The semiconductor device of claim 1, wherein the X-lines include a plurality of dummy line pairs, and each of the plurality of dummy line pairs includes lines that extend in the row direction across a corresponding row of cell mats, and each of the plurality of dummy line pairs includes an upper dummy line and a lower dummy line.

8. The semiconductor device of claim 7, wherein the word lines extending across a corresponding row of cell mats are disposed between the upper dummy line and the lower dummy line of each of the plurality of dummy line pairs.

9. The semiconductor device of claim 7, wherein:
the upper dummy line includes an upper main dummy line and an upper sub dummy line,
the lower dummy line includes a lower main dummy line and a lower sub dummy line,
the upper main dummy line and the lower main dummy line that-extend, in the row direction across a corresponding row of cell mats, from the X-decoder to the sub word line drivers to transfer a main dummy signal, and
the upper sub dummy line and the lower sub dummy line extend from the sub word line drivers to the cell mats to transfer a sub dummy signal.

10. The semiconductor device of claim 9, wherein each of the upper main dummy lines and each of the lower main dummy lines do not traverse inner areas of the cell mats.

11. The semiconductor device of claim 9, wherein each of the upper sub dummy lines and each of the lower sub dummy lines do not traverse the sub word line drivers.

12. A semiconductor device comprising:
a first memory bank;
a first X-decoder adjacent to the first memory bank in a row direction;
first X-lines extending from the first X-decoder across the first memory bank in the row direction;
a first edge connection line disposed in an edge area of the first memory bank; and a first inner connection line electrically connecting a first upper dummy line to a first lower dummy line in the first X-decoder,
wherein:
the first memory bank includes:
a plurality of first cell mats and a plurality of first sub word line drivers alternately arranged in the row direction,
the first X-lines that extend across a row of the plurality of first cell mats and the plurality of first sub word line drivers alternately arranged include the first upper dummy line, the first lower dummy line, and first word lines disposed between the first upper dummy line and the first lower dummy line, and
the first edge connection line electrically connects the first upper dummy line to the first lower dummy line.

13. The semiconductor device of claim 12, wherein the upper dummy line and the lower dummy line share a common switch circuit disposed in the X-decoder.

14. The semiconductor device of claim 12, further comprising:
a second memory bank;
a second X-decoder adjacent to the second memory bank in the row direction;
second X-lines extending from the second X-decoder across the second memory bank in the row direction;
a second edge connection line disposed in an edge area of the second memory bank; and
an inter-bank connection line,
wherein:
the second memory bank includes a plurality of second cell mats and a plurality of second sub word line drivers alternately arranged in the row direction,
the second X-lines that extend across a row of the plurality of first cell mats and the plurality of first sub word line drivers alternately arranged include a second upper dummy line, a second lower dummy line, and second word lines disposed between the second upper dummy line and the second lower dummy line,
the second edge connection line electrically connects the second upper dummy line to the second lower dummy line, and
the inter-bank connection line electrically connects the first edge connection line to the second edge connection line.

15. The semiconductor device of claim 14, wherein:
a row of the plurality of first cell mats and the plurality of first sub word line drivers alternately arranged, corresponding first word lines, the first upper dummy line and the first lower dummy line, the first X-decoder, and the first edge connection line form a first array,
a row of the plurality of second cell mats and the plurality of second sub word line drivers alternately arranged, corresponding second word lines, the second upper dummy line and the second lower dummy line, the second X-decoder, and the second edge connection line form a second array, and
the first array and the second array have mirrored layouts.

16. A semiconductor device comprising:
a memory bank;
an X-decoder adjacent to the memory bank in a row direction;
X-lines extending from the X-decoder across the memory bank in the row direction; and
a connection line,
wherein:

the memory bank includes a plurality of cell mats and a plurality of sub word line drivers alternately arranged in the row direction, the X-lines include an upper dummy line, a lower dummy line, and a plurality of word lines disposed between the upper dummy line and the lower dummy line, and the upper dummy line, the lower dummy line, and the plurality of word lines traverse a row of the cell mats and the sub word line drivers alternately arranged in the row direction, wherein the connection line includes:

an inner connection line electrically connecting the upper dummy line to the lower dummy line in the X-decoder, and an edge connection line electrically connecting the upper dummy line to the lower dummy line in an edge area of the memory bank.

17. The semiconductor device of claim 16, wherein the upper dummy line and the lower dummy line are commonly electrically connected to a common switch circuit in the X-decoder.

\* \* \* \* \*